(12) United States Patent
Chi et al.

(10) Patent No.: US 12,400,144 B2
(45) Date of Patent: Aug. 26, 2025

(54) MACHINE LEARNING FOR COMPUTATIONAL PATTERNING

(71) Applicant: INTERNATIONAL BUSINESS MACHINES CORPORATION, Armonk, NY (US)

(72) Inventors: Cheng Chi, Jersey City, NJ (US); Julian Timothy Dolby, Bronx, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 701 days.

(21) Appl. No.: 17/563,575

(22) Filed: Dec. 28, 2021

(65) Prior Publication Data
US 2023/0206112 A1    Jun. 29, 2023

(51) Int. Cl.
| | |
|---|---|
| G06N 20/00 | (2019.01) |
| G03F 1/36 | (2012.01) |
| G03F 1/70 | (2012.01) |
| G03F 7/00 | (2006.01) |
| G06F 30/30 | (2020.01) |
| G06F 30/398 | (2020.01) |

(52) U.S. Cl.
CPC ............ *G06N 20/00* (2019.01); *G03F 1/36* (2013.01); *G03F 1/70* (2013.01); *G03F 7/70441* (2013.01); *G03F 7/705* (2013.01); *G06F 30/398* (2020.01)

(58) Field of Classification Search
None
See application file for complete search history.

(56) References Cited

U.S. PATENT DOCUMENTS

2008/0077907 A1* 3/2008 Kulkarni ............... G03F 1/36
                                                716/53
2020/0380362 A1* 12/2020 Cao .................... G06N 3/04
(Continued)

OTHER PUBLICATIONS

X. Ma et al., "Fast pixel-based optical proximity correction based on nonparametric kernel regression," J. Micro/Nanolith. MEMS MOEMS 13(4), Oct.-Dec. 2014, 12 pages. (Year: 2014).*
(Continued)

*Primary Examiner* — Leigh M Garbowski
(74) *Attorney, Agent, or Firm* — Tutunjian & Bitetto, P.C.; Samuel Waldbaum (57) ABSTRACT

A computer-implemented method is provided for creating a photolithographic mask. The method includes, in a model building stage, obtaining lithography polygon coordinates from an input lithography target layout. The method further includes, in the model building stage, obtaining mask polygon coordinates from an input mask layout from a test mask. The method also includes, in the model building stage, obtaining correlated mask to lithography features from the lithography polygon coordinates and the mask polygon coordinates. The method additionally includes, in the model building stage, performing linear regression on the correlated mask to lithography features to obtain a machine learning model for predicting an output mask from an input lithography target design. The method further includes, in an inference stage, predicting a given output mask from a given input lithography target design using the machine learning model.

20 Claims, 8 Drawing Sheets

(56) References Cited

U.S. PATENT DOCUMENTS

2023/0100578 A1* 3/2023 Cao .................... G03F 7/70441
                                                          716/53
2023/0132893 A1* 5/2023 Kwon ...................... G03F 1/70
                                                          430/5

OTHER PUBLICATIONS

A. Kabeel et al., "Machine Learning using retarget data to improve accuracy of fast lithographic hotspot detection," Design-Process-Technology Co-optimization for Manufacturability XIV, Proc. of SPIE vol. 11328, 7 pages. (Year: 2020).*

H. Abdelghany et al., "Implementing Machine Learning OPC on Product Layouts," Design-Process-Technology Co-optimization for Manufacturability XIV, Proc. of SPIE vol. 11328, 9 pages. (Year: 2020).*

P. Evanschitzky et al., "Mask Defect detection with hybrid deep learning network," J. Micro./Nanopattern. Mater. Metrol., Oct.-Dec. 2021, vol. 20(4), 18 pages. (Year: 2021).*

Yang, Haoyu, et al. "GAN-OPC: Mask optimization with lithography-guided generative adversarial nets", IEEE Transactions on Computer-Aided Design of Integrated Circuits and Systems. Sep. 4, 2019, pp. 1-6.

Cao, Yu. "Machine Learning in Computational Lithography", ASML—Brion. Feb. 2019, pp. 1-20.

* cited by examiner

MACHINE LEARNING FOR COMPUTATIONAL PATTERNING

BACKGROUND

The present invention generally relates to machine learning, and more particularly to machine learning for computational patterning.

Optical proximity correction (OPC) is a photolithography enhancement technique commonly used to compensate for image errors due to diffraction or process effects. The need for OPC is seen mainly in the making of semiconductor devices and is due to the limitations of light to maintain the edge placement integrity of the original design, after processing, into the etched image on the silicon wafer.

Building a physical model for OPC takes a lot of labor and computational time. In some scenarios, a (e.g. simulator match) model must be rebuilt for different vendors. Here, there is a need for producing OPC mask designs from lithography target data to achieve a much shorter run time.

SUMMARY

According to aspects of the present invention, a computer-implemented method is provided for creating a photolithographic mask. The method includes, in a model building stage, obtaining lithography polygon coordinates from an input lithography target layout. The method further includes, in the model building stage, obtaining mask polygon coordinates from an input mask layout from a test mask. The method also includes, in the model building stage, obtaining correlated mask to lithography features from the lithography polygon coordinates and the mask polygon coordinates. The method additionally includes, in the model building stage, performing linear regression on the correlated mask to lithography features to obtain a machine learning model for predicting an output mask from an input lithography target design. The method further includes, in an inference stage, predicting a given output mask from a given input lithography target design using the machine learning model.

According to other aspects of the present invention, a computer program product is provided for creating a photolithographic mask. The computer program product includes a non-transitory computer readable storage medium having program instructions embodied therewith, the program instructions executable by a computer to cause the computer to perform a method. The method includes, in a model building stage, by a processor device of the computer, obtaining lithography polygon coordinates from an input lithography target layout, obtaining mask polygon coordinates from an input mask layout from a test mask, obtaining correlated mask to lithography features from the lithography polygon coordinates and the mask polygon coordinates, and performing linear regression on the correlated mask to lithography features to obtain a machine learning model for predicting a lithography target design from an input mask. The method further includes, in an inference stage, by the processing device of the computer, predicting a given lithography target design from a given input mask using the machine learning model.

According to yet other aspects of the present invention, a computer processing system is provided for creating a photolithographic mask. The computer processing system includes a memory device for storing program code. The computer processor system further includes a processor device operatively coupled to the memory device for running the program code to, in a model building stage, obtain lithography polygon coordinates from an input lithography target layout, obtain mask polygon coordinates from an input mask layout from a test mask, obtain correlated mask to lithography features from the lithography polygon coordinates and the mask polygon coordinates, and perform linear regression on the correlated mask to lithography features to obtain a machine learning model for predicting an output mask from an input lithography target design. The processor device further runs the program code to, in an inference stage, predict a given output mask from a given input lithography target design using the machine learning model.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are directed to machine learning for computational patterning.

In embodiments of the present invention, a methodology is provided to use machine learning to produce OPC mask designs from lithography target data.

In embodiments of the present invention, machine learning can be used to learn the correlation between wafer data and mask data.

In embodiment of the present invention, machine learning can be used to learn the correlation between masks generated from two vendors. For example, in an embodiment, a OPCV macro can be scanned and a different set of design/mask layouts regenerated therefrom.

Figure 1:
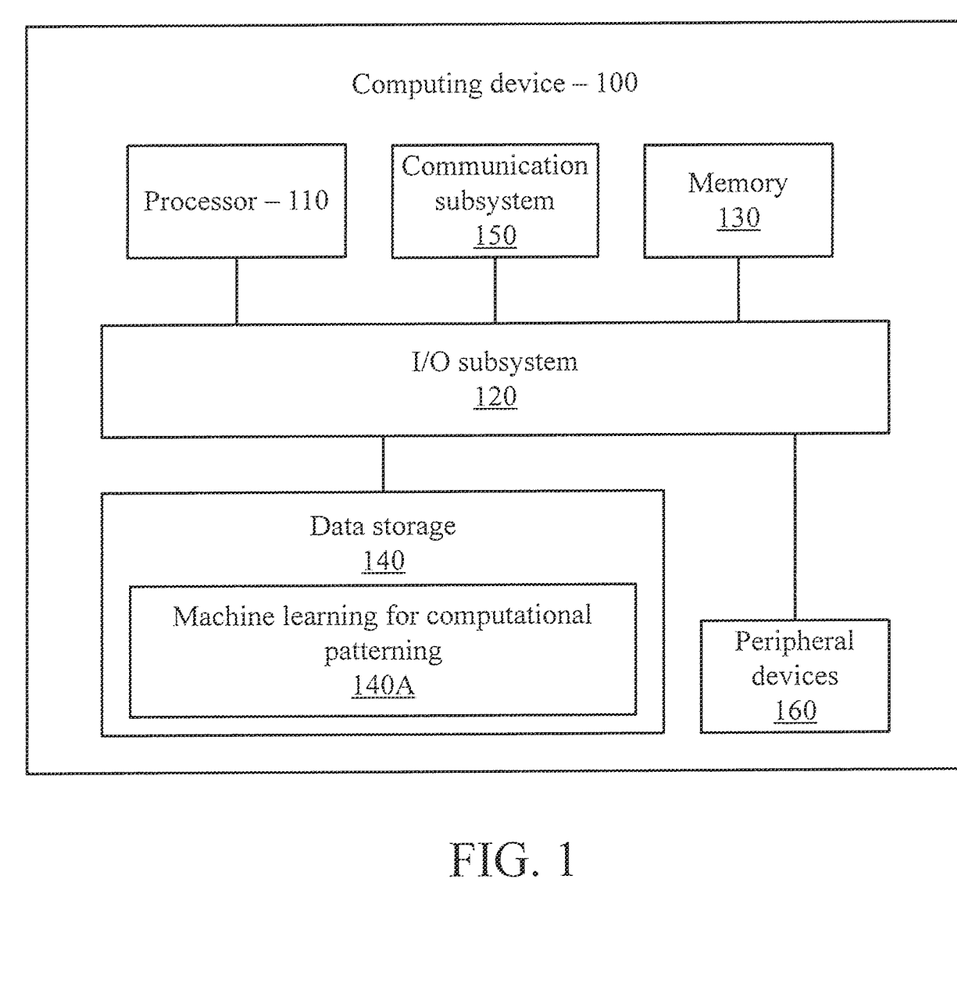
FIG. 1 is a block diagram showing an exemplary computing device, in accordance with an embodiment of the present invention.

FIG. 1 is a block diagram showing an exemplary computing device 100, in accordance with an embodiment of the present invention. The computing device 100 is configured to perform machine learning for computational patterning.

The computing device 100 may be embodied as any type of computation or computer device capable of performing the functions described herein, including, without limitation, a computer, a server, a rack based server, a blade server, a workstation, a desktop computer, a laptop computer, a notebook computer, a tablet computer, a mobile computing device, a wearable computing device, a network appliance, a web appliance, a distributed computing system, a processor-based system, and/or a consumer electronic device. Additionally or alternatively, the computing device 100 may be embodied as a one or more compute sleds, memory sleds, or other racks, sleds, computing chassis, or other components of a physically disaggregated computing device. As shown in FIG. 1, the computing device 100 illustratively includes the processor 110, an input/output subsystem 120, a memory 130, a data storage device 140, and a communication subsystem 150, and/or other components and devices commonly found in a server or similar computing device. Of course, the computing device 100 may include other or additional components, such as those commonly found in a server computer (e.g., various input/output devices), in other embodiments. Additionally, in some embodiments, one or more of the illustrative components may be incorporated in, or otherwise form a portion of, another component. For example, the memory 130, or portions thereof, may be incorporated in the processor 110 in some embodiments.

The processor 110 may be embodied as any type of processor capable of performing the functions described herein. The processor 110 may be embodied as a single processor, multiple processors, a Central Processing Unit(s) (CPU(s)), a Graphics Processing Unit(s) (GPU(s)), a single or multi-core processor(s), a digital signal processor(s), a microcontroller(s), or other processor(s) or processing/controlling circuit(s).

The memory 130 may be embodied as any type of volatile or non-volatile memory or data storage capable of performing the functions described herein. In operation, the memory 130 may store various data and software used during operation of the computing device 100, such as operating systems, applications, programs, libraries, and drivers. The memory 130 is communicatively coupled to the processor 110 via the I/O subsystem 120, which may be embodied as circuitry and/or components to facilitate input/output operations with the processor 110 the memory 130, and other components of the computing device 100. For example, the I/O subsystem 120 may be embodied as, or otherwise include, memory controller hubs, input/output control hubs, platform controller hubs, integrated control circuitry, firmware devices, communication links (e.g., point-to-point links, bus links, wires, cables, light guides, printed circuit board traces, etc.) and/or other components and subsystems to facilitate the input/output operations. In some embodiments, the I/O subsystem 120 may form a portion of a system-on-a-chip (SOC) and be incorporated, along with the processor 110, the memory 130, and other components of the computing device 100, on a single integrated circuit chip.

The data storage device 140 may be embodied as any type of device or devices configured for short-term or long-term storage of data such as, for example, memory devices and circuits, memory cards, hard disk drives, solid state drives, or other data storage devices. The data storage device 140 can store program code 140A for machine learning for computational patterning. The communication subsystem 150 of the computing device 100 may be embodied as any network interface controller or other communication circuit, device, or collection thereof, capable of enabling communications between the computing device 100 and other remote devices over a network. The communication subsystem 150 may be configured to use any one or more communication technology (e.g., wired or wireless communications) and associated protocols (e.g., Ethernet, InfiniBand®, Bluetooth®, Wi-Fi®, WiMAX, etc.) to effect such communication.

As shown, the computing device 100 may also include one or more peripheral devices 160. The peripheral devices 160 may include any number of additional input/output devices, interface devices, and/or other peripheral devices. For example, in some embodiments, the peripheral devices 160 may include a display, touch screen, graphics circuitry, keyboard, mouse, speaker system, microphone, network interface, and/or other input/output devices, interface devices, and/or peripheral devices.

Of course, the computing device 100 may also include other elements (not shown), as readily contemplated by one of skill in the art, as well as omit certain elements. For example, various other input devices and/or output devices can be included in computing device 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 100 are readily contemplated by one of ordinary skill in the art given the teachings of the present invention provided herein.

As employed herein, the term "hardware processor subsystem" or "hardware processor" can refer to a processor, memory (including RAM, cache(s), and so forth), software (including memory management software) or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

Figure 2:
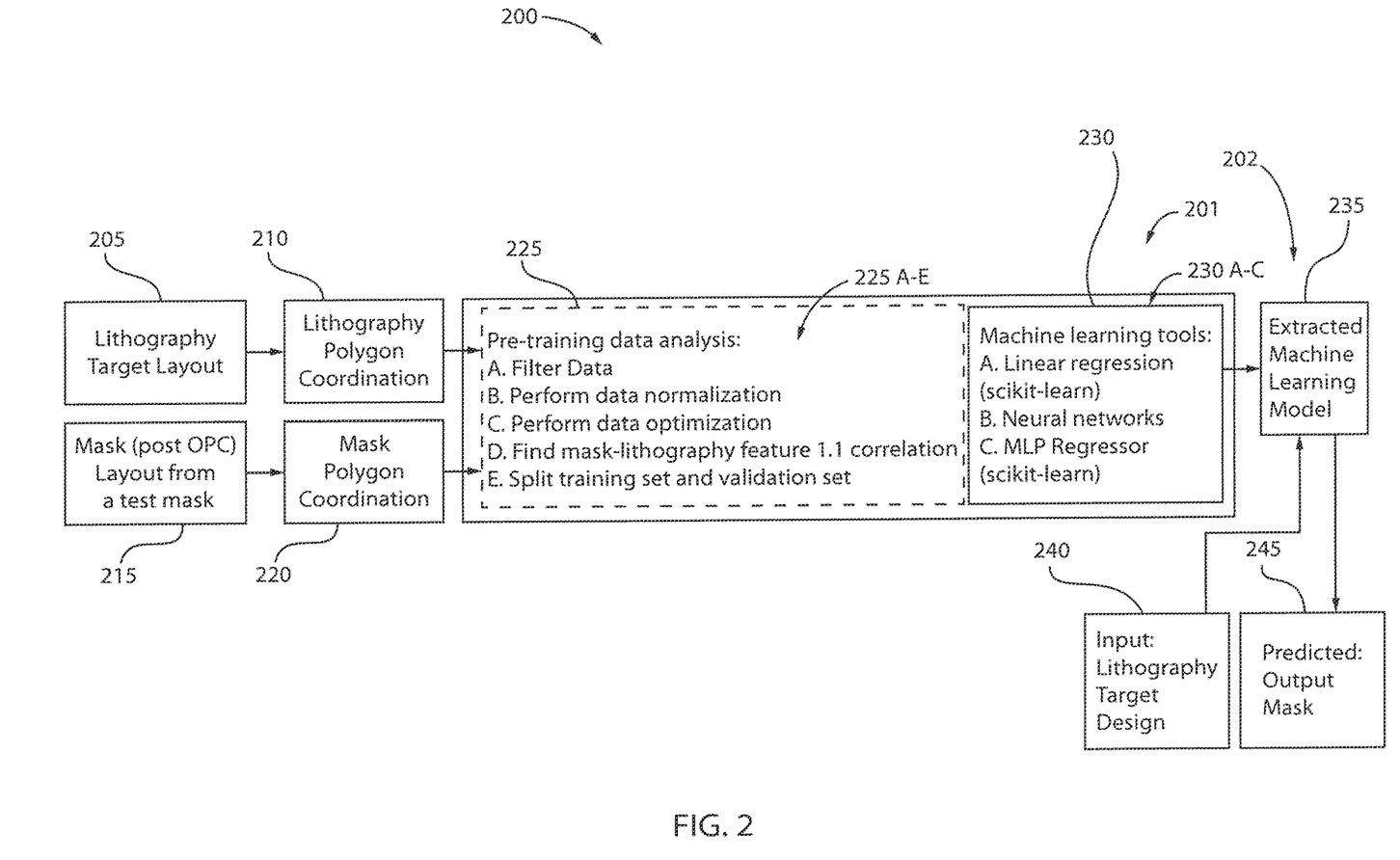
FIG. 2 is a high-level block diagram showing an exemplary system/method for machine learning for computational patterning, in accordance with an embodiment of the present invention.

These and other variations of a hardware processor subsystem are also contemplated in accordance with embodiments of the present invention FIG. 2 is a high-level block diagram showing an exemplary system/method 200 for machine learning for computational patterning, in accordance with an embodiment of the present invention.

System/method 200 includes a model building stage 201 and an inference stage 202.

In the model building stage 201, the inputs are a lithography target layout and a mask (post OPC) layout from a test mask, and the output is a machine learning model. Blocks 205 through 235 correspond to the model building stage 201.

In the inference stage 202, the input is a lithography layout and the output is a predicted mask to create the lithography layout. Blocks 240 through 245 correspond to the inference stage 202.

At block 205, provide a lithography target layout.

At block 210, perform lithography polygon coordination 283 on the lithography target layout. Polygons are usually represented by the coordinates of their vertices, Block 210 involves identifying the coordinates of the lithography polygons by their vertice coordinates.

At block 215, provide a mask (post-OPC) layout from a test mask.

At block 220, perform mask polygon coordination on the mask layout. Block 320 involves identifying the coordinates of the mask polygons by their vertice coordinates.

At block 225, perform pre-training data analysis based on the lithography polygon coordination and the mask polygon coordination. To that end, filter the data, normalize the data, optimize the data, find mask-lithography feature 1-1 correlation, and split the training set and validation set.

In an embodiment, block 225 can include one or more of blocks 225A through 225E.

At block 225A, perform data filtering such that the input data is chosen based the ground rule (e.g. minimum dimension and space) of the test masks.

At block 225B, perform data normalization. For example, using awk or other scripts, transform the standard format into rows of points (coordinates) for each feature for both lithography and mask files.

At block 225C, perform data optimization. For example, remove the redundant elements of points. Since lines are vertical or horizontal, many coordinates are redundant.

At block 225D, find mask-lithography feature 1-1 correlation.

At block 225E, split the training and validation sets.

At block 230, apply machine learning tools to build a model predicting a mask from lithography features or predicting how a wafer design will look from a mask. To that end, perform linear regression (e.g., Scikit-learn®), apply neural networks, and a MLPRegressor (e.g., Scikit-learn®).

In an embodiment, block 230 can include one or more of blocks 230A through 230C.

At block 230A, perform linear regression on the processed input data, which is the correlated mask to lithography features.

At block 230B, build neural networks. This can involve, for example, Tensorflow® or Pytorch®.

At block 230C, apply a MLPRegressor (e.g., Scikit-learn®). The input data is loaded into Scikit-learn®, the input data is split into a training set and a test set. The model is fitted by the MLPRegressor with a specific neural network. By adjusting a number of hidden layer sizes, iteration number, and solver, one can achieve the most accurate model with lowest root mean square of the fitting error.

At block 235, output an extracted machine learning model.

At block 240, input a lithography target design to the machine learning model.

At block 245, output a mask from the machine learning model.

Figure 3:
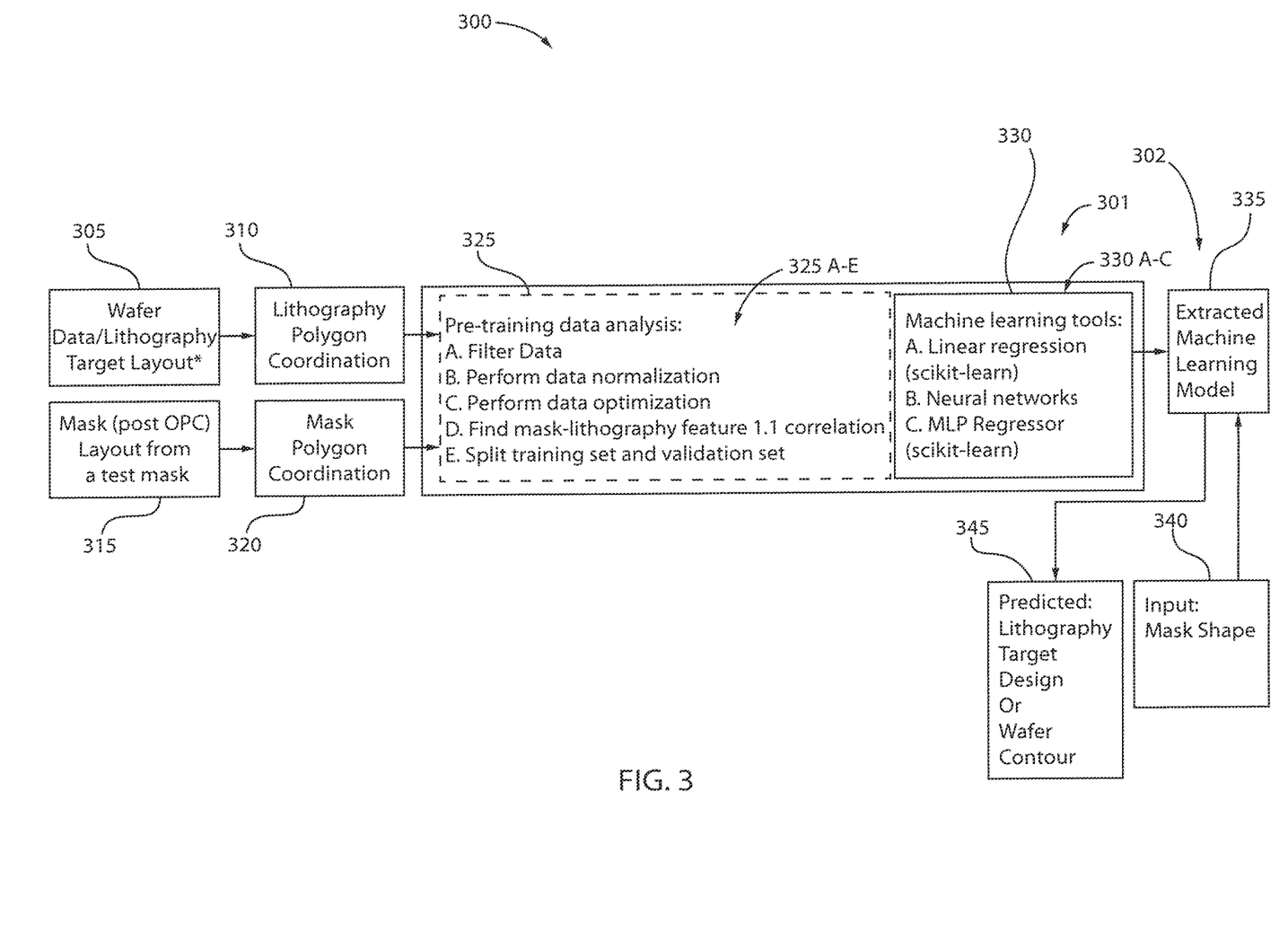
FIG. 3 is a high-level block diagram showing another exemplary system/method for machine learning for computational patterning, in accordance with an embodiment of the present invention.

FIG. 3 is an high-level block diagram showing another exemplary system/method 300 for machine learning for computational patterning, in accordance with an embodiment of the present invention.

System/method 300 includes a model building stage 301 and an inference stage 302.

In the model building stage 301, the inputs are wafer data/lithography target layout and a mask (post OPC) layout from a test mask, and the output is a machine learning model. Blocks 305 through 335 correspond to the model building stage 301.

In the inference stage 302, the input is a mask shape and the output is a predicted lithography design or wafer contour. Blocks 340 through 345 correspond to the inference stage 302.

At block 305, provide wafer data/lithography target layout. If wafer data is needed due to, e.g., a higher resolution model being required, then contour, target size, and so forth can be used.

At block 310, perform lithography polygon coordination on the lithography target layout to obtain lithograph polygon coordinates. Polygons are usually represented by the coordinates of their vertices. Block 310 involves identifying the coordinates of the lithography polygons by their vertice coordinates.

At block 315, provide a mask (post-OPC) layout from a test mask,

At block 320, perform mask polygon coordination on the mask layout. Block 320 involves identifying the coordinates of the mask polygons by their vertice coordinates.

At block 325, perform pre-training data analysis based on the lithography polygon coordination and the mask polygon coordination. To that end, filter the data, normalize the data, optimize the data, find mask-lithography feature 1-1 correlation, and split the training set and validation set.

In an embodiment, block 325 can include one or more of blocks 325A through 325E.

At block 325A, perform data filtering such that the input data is chosen based the ground rule (e.g. minimum dimension and space) of the test masks.

At block 325B, perform data normalization. For example, using awk or other scripts, transform the standard format into rows of points (coordinates) for each feature for both lithography and mask files.

At block 325C, perform data optimization. For example, remove the redundant elements of points. Since lines are vertical or horizontal, many coordinates are redundant.

At block 325D, find mask-lithography feature 1-1 correlation.

At block 325E, split the training and validation sets.

At block 330, apply machine learning tools to build a model predicting a mask from lithography features or predicting how a wafer design will look from a mask. To that end, perform linear regression (e.g., Scikit-learn®), apply neural networks, and a MLPRegressor (e.g., Scikit-learn®).

In an embodiment, block 330 can include one or more of blocks 330A through 330C.

At block 330A, perform linear regression on the correlated mask to lithography features.

At block 330B, build neural networks. This can involve, for example, Tensorflow® or Pytorch®.

At block 330C, apply a MLPRegressor (e.g., Scikit-learn®). The input data is loaded into Scikit-learn®, the input data is split into a training set and a test set. The model is fitted by the MLPRegressor with a specific neural network. By adjusting a number of hidden layer sizes, iteration number, and solver, one can achieve the most accurate model with lowest root mean square of the fitting error.

At block 335, output an extracted machine learning model.

At block 340, input a mask shape to the machine learning model.

At block 345, output a lithography target design or wafer contour from the machine learning model.

Figure 4:
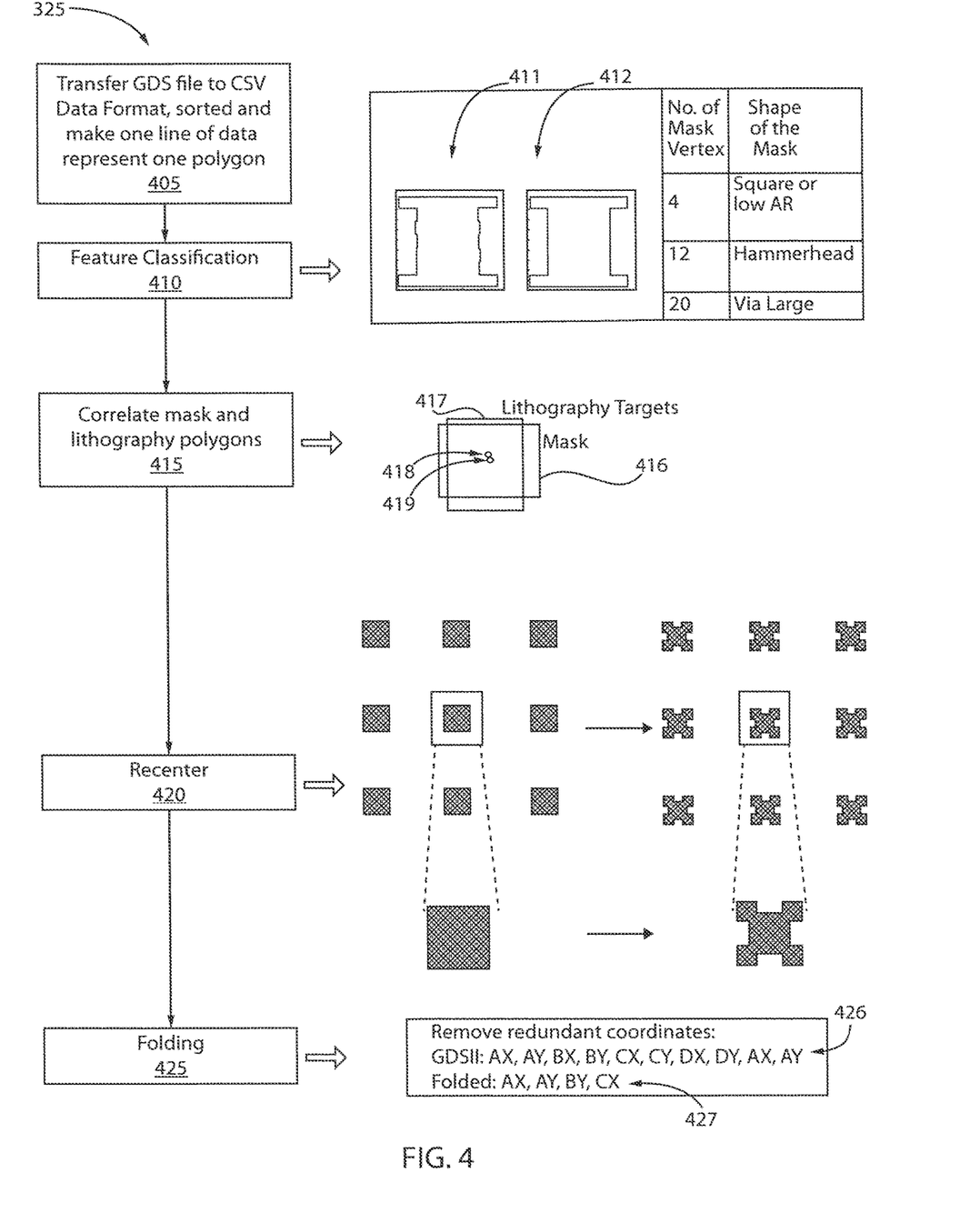
FIG. 4 is a block diagram further showing various aspects of block 325 of FIG. 3 for performing pre-training data analysis, in accordance with an embodiment of the present invention.

FIG. 4 is a block diagram further showing various aspects of block 325 of FIG. 3 for performing pre-training data analysis, in accordance with an embodiment of the present invention.

At block 405, transfer a GDS file (e.g., GDS-I or II) to a Comma Separated Values (CSV) data format, sort the CSV data in rows of coordinates where one row (line) of the data represents one polygon, and smooth the edges of the polygons to remove stitches. Stitches on the edges are usually the consequence of the dissection of the previous keyword.

At block 410, perform feature classification on the CSV data to identify features 411 and 412 therein based on the number of vertices in the post OPCed mask shape. Features are identified as polygons. Features with different post OPCed mask shapes are filtered and separated into different training data sets for different models.

At block 415, correlate mask 416 and lithography polygons 417 based on their centroids 418 and 419. This can involve aligning closest lithography target and mask target centers based on their centroids. For polygons with the same size and environment, the key properties are extracted and these polygons are treated as the same. By doing this, the trained data needed is significantly decreased and the training data does not need to cover the entire layout.

At block 420, recenter the features in the lithography and mask layouts. This is needed because of moving the centers for the previous center alignments.

Figure 8:
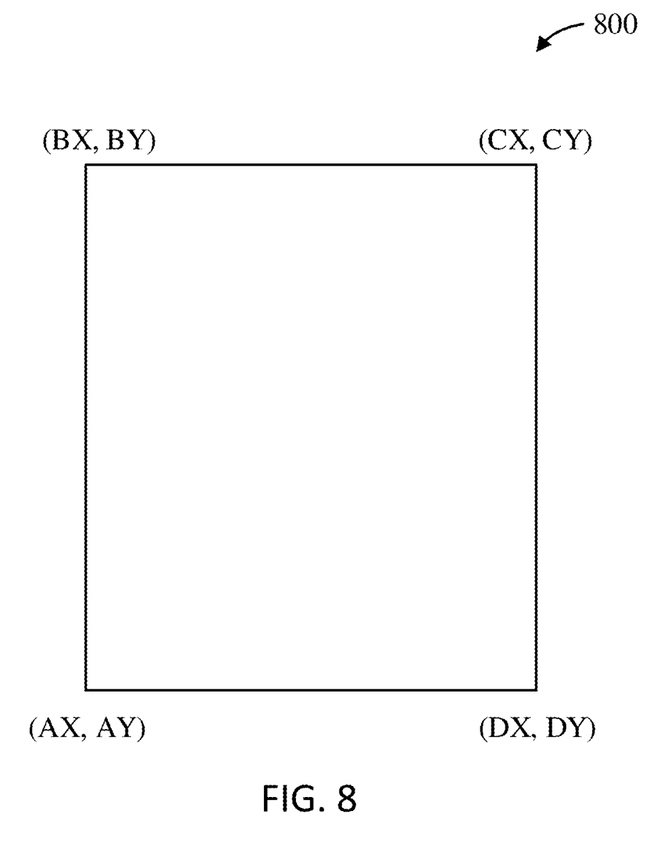
FIG. 8 is a diagram showing four extracted polygon coordinates 800, in accordance with an embodiment of the present invention.

At block 425, perform folding by removing redundant coordinates 426 into folded coordinates 427 since lines are to be horizontal and vertical (see, FIG. 8).

After training and testing, the full layout can be recovered by using the centroid coordinates of the polygons and their predicted shapes.

Figure 5:
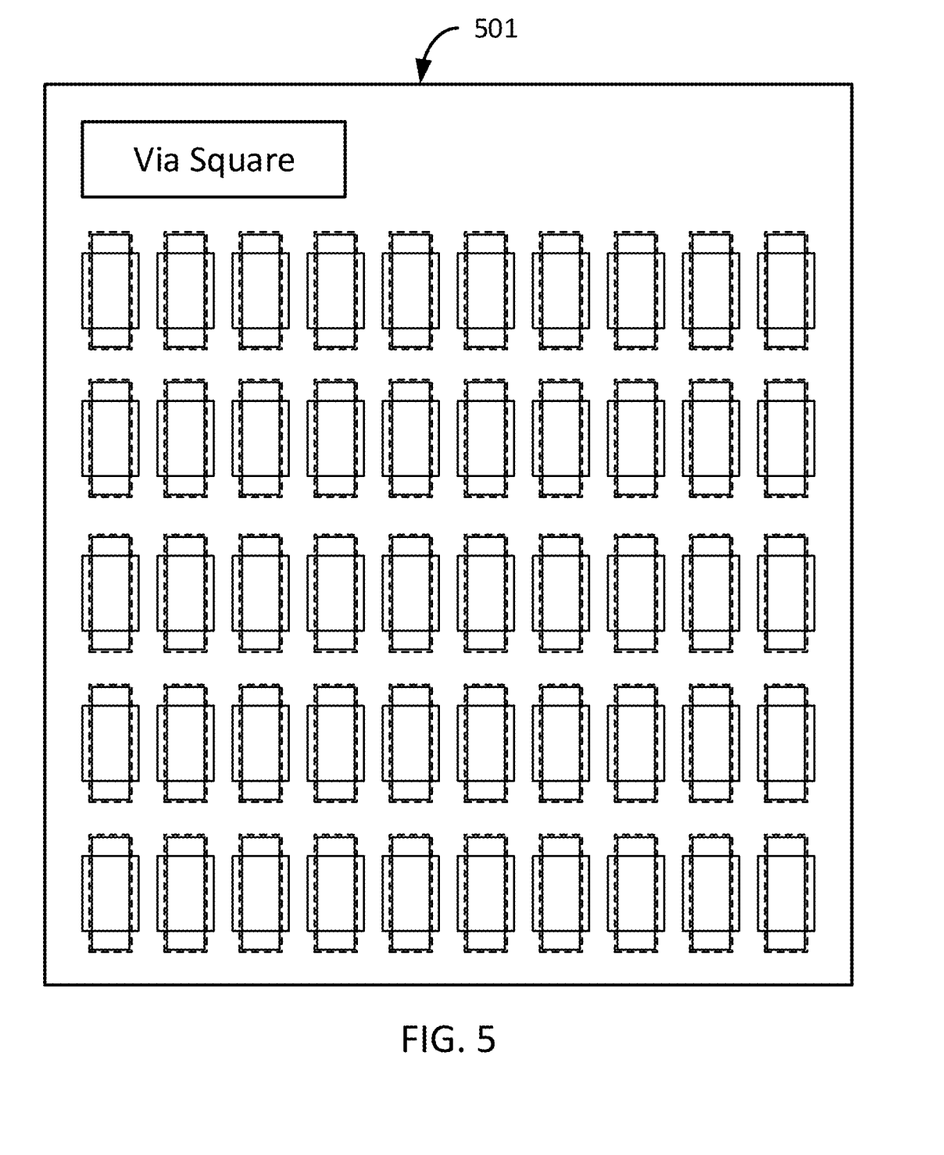
FIG. 5 is a block diagram showing an exemplary mask having mask targets for a rectangular/low aspect ratio via, in accordance with an embodiment of the present invention.
Figure 6:
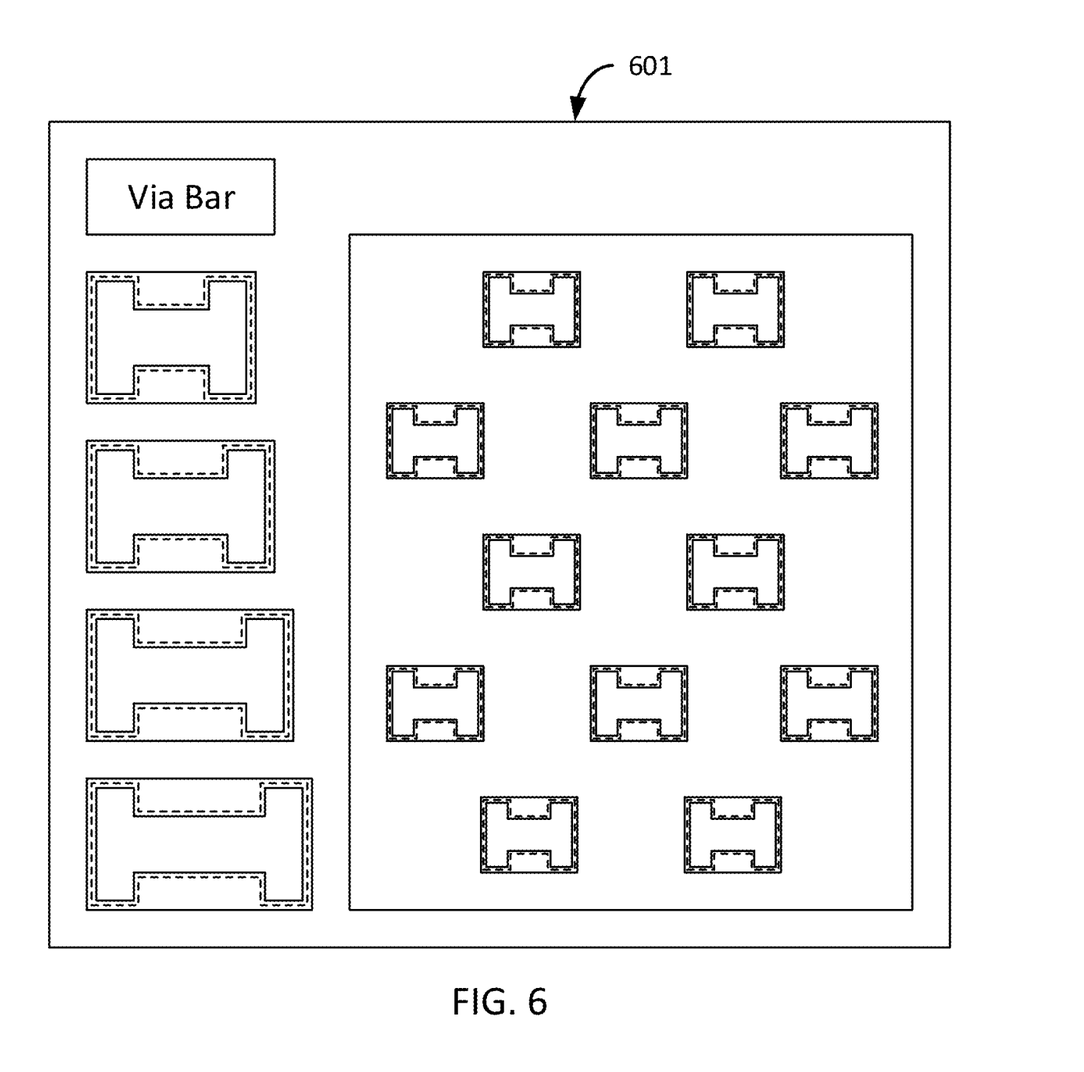
FIG. 6 is a block diagram showing another exemplary mask having mask targets for a bar/high aspect via, in accordance with an embodiment of the present invention.
Figure 7:
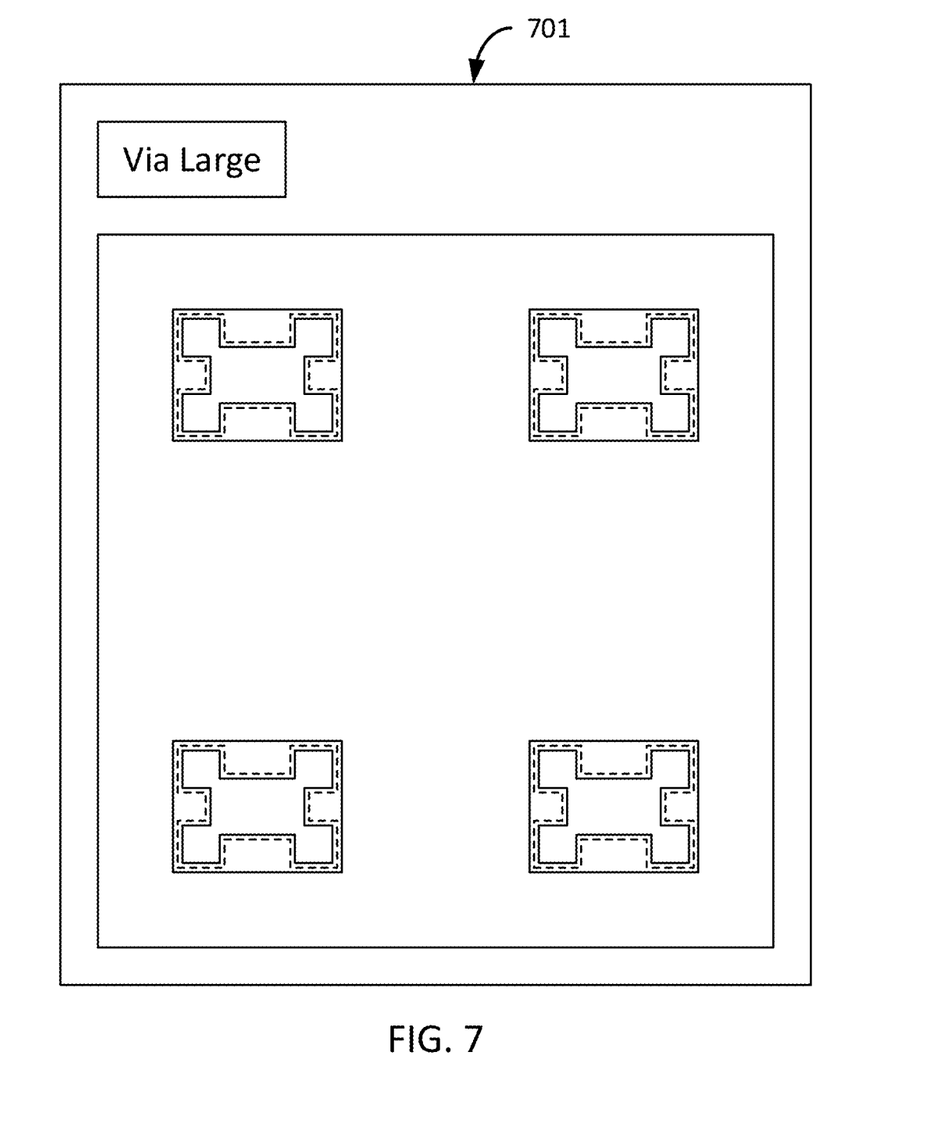
FIG. 7 is a block diagram showing yet another exemplary mask having mask targets for a large via, in accordance with an embodiment of the present invention.

FIGS. 5-7 show exemplary visualization results of post machine learning mask shapes compared with mask shapes predicted by previous keywords for the following 3 circumstances: rectangular/low aspect ratio via, high aspect ratio via, and large via respectively, in accordance with various embodiments of the present invention. In FIGS. 5-7, the dashed lines represent the mask from the previous keyword and the solid lines represent the mask predicted by learning. As can be seen, the mask shapes predicted by machine learning are very identical to the mask shapes predicted by the previous keywords.

FIG. 5 is a block diagram showing an exemplary mask 501 having mask targets for a rectangular/low aspect ratio via, in accordance with an embodiment of the present invention.

This can represent one model the output of one model.

FIG. 6 is a block diagram showing another exemplary mask 601 having mask targets for a bar/high aspect via, in accordance with an embodiment of the present invention.

This can represent the output of another model.

FIG. 7 is a block diagram showing yet another exemplary mask 701 having mask targets for a large via, in accordance with an embodiment of the present invention.

This can represent the output of yet another model.

That is, the data can be separated such that rectangular vias are represented by one model, bar vias are represented by another model, and large vias are represented by yet another model. In this way, each model is specifically directed to a particular shape for optimized prediction.

FIG. 8 is a diagram showing four extracted polygon coordinates 800, in accordance with an embodiment of the present invention.

The top left corner coordinates are (BX, BY), the top right corner coordinates are (CX, CY), the bottom left coordinates are (AX, AY), and the bottom right coordinates are (DX, DY).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A computer-implemented method for creating a photolithographic mask, comprising:
   in a model building stage:
   obtaining lithography polygon coordinates from an input lithography target layout;
   obtaining mask polygon coordinates from an input mask layout from a test mask;
   obtaining correlated mask to lithography features from the lithography polygon coordinates and the mask polygon coordinates; and
   performing linear regression on the correlated mask to lithography features to obtain a machine learning model for predicting an output mask from an input lithography target design;
   in an inference stage;
   predicting a given output mask from a given input lithography target design using the machine learning model; and
   creating a photolithographic mask using the given output mask.

2. The computer-implemented method of claim 1, further comprising normalizing the lithography polygon coordinates and the mask polygon coordinates into lithography rows of points and mask rows of points for each of a plurality of features represented thereby.

3. The computer-implemented method of claim 2, wherein obtaining correlated mask to lithography features comprises matching the lithography rows of points to the mask rows of points by computing and aligning closest centroids of lithography polygons and mask polygons.

4. The computer-implemented method of claim 1, wherein the input lithography target layout comprises a design from a different vendor that the input mask layout.

5. The computer-implemented method of claim 1, further comprising smooth edges of the lithography polygon coordinates and the mask polygon coordinates to remove stitches from the edges.

6. The computer-implemented method of claim 1, wherein obtaining lithography polygon coordinates comprises obtaining rows of comma separated values, with each of the rows representing a respective lithography polygon.

7. The computer-implemented method of claim 1, wherein obtaining mask polygon coordinates comprises obtaining rows of comma separated values, with each of the rows representing a respective mask polygon.

8. The computer-implemented method of claim 1, wherein performing linear regression on the correlated mask to lithography features to obtain a machine learning model results in a particular machine learning model for each of a plurality of mask shapes.

9. A computer program product for creating a photolithographic mask, the computer program product comprising a non-transitory computer readable storage medium having program instructions embodied therewith, the program instructions executable by a computer to cause the computer to perform a method comprising:
in a model building stage, by a processor device of the computer:
obtaining lithography polygon coordinates from an input lithography target layout;
obtaining mask polygon coordinates from an input mask layout from a test mask;
obtaining correlated mask to lithography features from the lithography polygon coordinates and the mask polygon coordinates; and
performing linear regression on the correlated mask to lithography features to obtain a machine learning model for predicting a lithography target design from an input mask;
in an inference stage, by the processing device of the computer:
predicting a given lithography target design from a given input mask using the machine learning model; and
creating a photolithographic mask using the given lithography target design.

10. The computer-implemented method of claim 9, further comprising normalizing the lithography polygon coordinates and the mask polygon coordinates into lithography rows of points and mask rows of points for each of a plurality of features represented thereby.

11. The computer-implemented method of claim 10, wherein obtaining correlated mask to lithography features comprises matching the lithography rows of points to the mask rows of points by computing and aligning closest centroids of lithography polygons and mask polygons.

12. The computer-implemented method of claim 9, wherein the input lithography target layout comprises a design from a different vendor that the input mask layout.

13. The computer-implemented method of claim 9, further comprising smooth edges of the lithography polygon coordinates and the mask polygon coordinates to remove stitches from the edges.

14. The computer-implemented method of claim 9, wherein obtaining lithography polygon coordinates comprises obtaining rows of comma separated values, with each of the rows representing a respective lithography polygon.

15. The computer-implemented method of claim 9, wherein obtaining mask polygon coordinates comprises obtaining rows of comma separated values, with each of the rows representing a respective mask polygon.

16. The computer-implemented method of claim 9, wherein performing linear regression on the correlated mask to lithography features to obtain a machine learning model results in a particular machine learning model for each of a plurality of mask shapes.

17. A computer processing system for creating a photolithographic mask, comprising:
a memory device for storing program code; and
a processor device operatively coupled to the memory device for running the program code to:
in a model building stage:
obtain lithography polygon coordinates from an input lithography target layout;
obtain mask polygon coordinates from an input mask layout from a test mask;
obtain correlated mask to lithography features from the lithography polygon coordinates and the mask polygon coordinates; and
perform linear regression on the correlated mask to lithography features to obtain a machine learning model for predicting an output mask from an input lithography target design;
in an inference stage:
predict a given output mask from a given input lithography target design using the machine learning model; and
create a photolithographic mask using the given output mask.

18. The computer processing system of claim 17, wherein the processor device further runs the program code to normalize the lithography polygon coordinates and the mask polygon coordinates into lithography rows of points and mask rows of points for each of a plurality of features represented thereby.

19. The computer processing system of claim 18, wherein obtaining correlated mask to lithography features comprises matching the lithography rows of points to the mask rows of points by computing and aligning closest centroids of lithography polygons and mask polygons.

20. The computer processing system of claim 17, wherein the input lithography target layout comprises a design from a different vendor that the input mask layout.

* * * * *